(12) United States Patent
Chrysler et al.

(10) Patent No.: US 6,967,840 B2
(45) Date of Patent: Nov. 22, 2005

(54) CLEARING OF VAPOR LOCK IN A MICROCHANNEL COOLING SUBSYSTEM

(75) Inventors: Gregory M. Chrysler, Chandler, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/814,051

(22) Filed: Mar. 31, 2004

(65) Prior Publication Data

US 2005/0219816 A1    Oct. 6, 2005

(51) Int. Cl.[7] .............................................. H05K 7/20
(52) U.S. Cl. ...................... 361/699; 361/700; 257/714; 174/15.1; 165/80.4
(58) Field of Search ................................ 361/689, 690, 361/698–700; 257/714, 715; 174/15.1, 15.2; 165/80.4, 104.33; 62/259.2

(56) References Cited

U.S. PATENT DOCUMENTS

| | | | |
|---|---|---|---|
| 3,598,180 A | * | 8/1971 | Moore, Jr. ................... 165/133 |
| 4,915,063 A | | 4/1990 | Stumpf |
| 6,024,542 A | | 2/2000 | Phillips et al. |
| 6,179,568 B1 | | 1/2001 | Phillips et al. |
| 6,628,002 B2 | * | 9/2003 | Ritz et al. ................... 257/712 |

* cited by examiner

*Primary Examiner*—Boris Chervinsky
(74) *Attorney, Agent, or Firm*—Schwabe, Williamson & Wyatt, P.C.

(57) ABSTRACT

Apparatus and methods in accordance with the present invention provide a system to create turbulence inside microchannels of a microchannel cooling subsystem to disrupt vapor locks therein.

26 Claims, 2 Drawing Sheets

Cooling System 1

Cooling System 1

Cooling System 1

CLEARING OF VAPOR LOCK IN A MICROCHANNEL COOLING SUBSYSTEM

FIELD OF THE INVENTION

The present invention relates to the field of integrated circuits, and, more particularly, to the clearing of vapor lock within microchannels of microchannel cooling subsystems.

BACKGROUND OF INVENTION

A microelectronic package comprises a microelectronic die electrically interconnected with a carrier substrate, and one or more other components, such as electrical interconnects, an integrated heat spreader, a heat sink, among others. An example of a microelectronic package is an integrated circuit microprocessor.

A microelectronic die comprises a plurality of interconnected microcircuits to perform electronic circuit functions. It generates heat as a result of the electrical activity of the microcircuits. In order to minimize the damaging effects of heat, passive and active thermal management devices are used. Such thermal management devices include heat sinks, heat spreaders, and fans, among many others. There are limitations in the use of each type of device, and in many cases, the thermal management device is specifically designed for a particular microelectronic die and package design and intended operations.

Non-uniform power distribution across the microelectronic die results in local areas of high heat flux (hot spots) that must be mitigated. The thermal management device must be able to maintain these hot spots at or below a specified temperature. This is very difficult when the local heat flux can be 10-times the microelectronic die average. Current devices are overwhelmed and limited in their ability to mitigate these local high heat flux sources. The thermal resistance between the heat sink and/or heat spreader is not low enough to adequately provide the necessary thermal mitigation in a reasonably sized system.

Currently, the localized heat generation is dissipated away from the microelectronic die once the heat has diffused to the surface. An Integrated Heat Spreader (IHS), heat sink, and/or a fan coupled to the surface do not have a major effect on spreading heat at the local-level within the microelectronic die. As a result, high temperature gradients and high-localized temperatures will continue to exist using the external methods of cooling.

Liquid pumps, embedded or external to the die, and microchannel cooling subsystems can address the problem of dissipating localized heat generation away from the microelectronic die, however vapor blockage can occur in the microchannels disrupting the cooling.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Apparatus and methods in accordance with embodiments of the present invention utilize active cooling technology to reduce thermal gradients and operating temperature of a microelectronic die.

Embodiments of cooling systems in accordance with the present invention are provided below. It is understood that these are provided as examples of various embodiments for practicing the present invention, but are not intended to limit the present invention thereto. Embodiments of a cooling system comprising cooling fluid with a turbulent or laminar flow to a microelectronic cooling subsystem (or cooling devices), in accordance with embodiments the present invention, may include a pump and a bubble generator.

Figure 1:
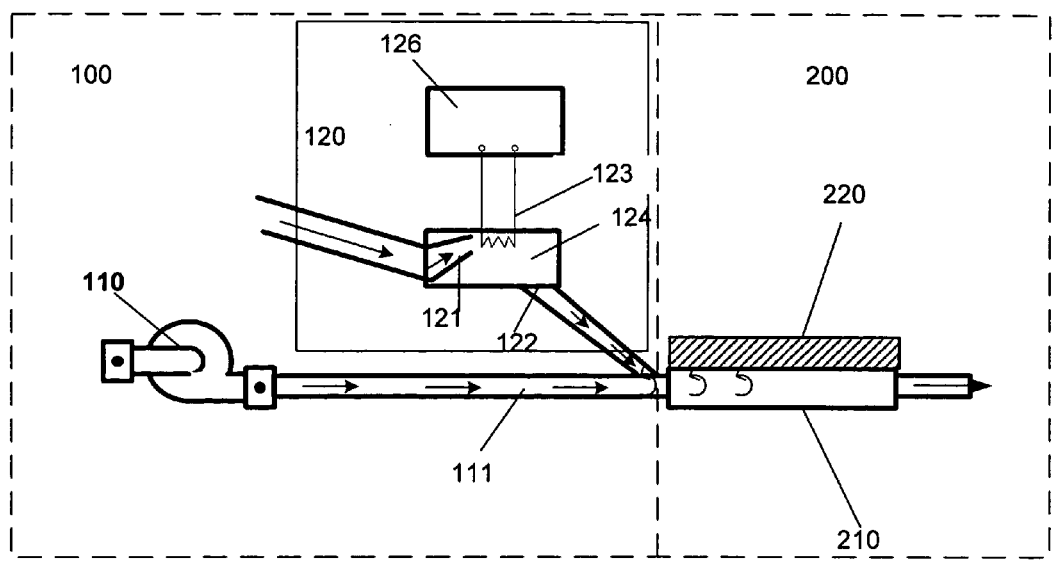
FIG. 1 is a functional view of a pumping mechanism coupled to a microchannel cooling subsystem, in accordance with one embodiment of the present invention.

FIG. 1 is a functional view of a cooling system 1, in accordance with one embodiment of the invention. As illustrated, a pumping mechanism 100 is coupled to a microchannel cooling subsystem 200 to provide the microchannel cooling subsystem 200 with fluid flow 111, and if needed, causing turbulence in the fluid inside the microchannels of the microchannel cooling subsystem 200, to e.g. assist in the clearing of vapor locks in the microchannels (not shown) and increase the total rate of heat transfer from the microchannels. Turbulence may also be referred to as one or more higher pressure pulses.

For the embodiment, the pumping mechanism 100 comprises primary pump 110, and auxiliary flow generator 120, both coupled to an input of the microchannel cooling subsystem 200. Pump 100 provides a primary fluid flow 111 of the cooling fluid to the microchannel cooling subsystem 200. The fluid flow is provided by pump 110 at a first pressure level. Auxiliary flow generator 120 provides an auxiliary flow at a second pressure level to cause turbulence to the fluid inside the microchannels of the microchannel cooling subsystem, to contribute to the clearing of vapor locks inside the microchannels.

In various embodiments, pump 110 may be selected from pumps such as a vane pump, a piston pump, a diaphragm pump, electrokinetic (EK) pump (also known as a electroosmotic (EO) pump), or other suitable pumps; these pumps are listed as examples only and are not to be considered exhaustive.

For the embodiment, auxiliary flow generator 120 comprises a chamber 124 to contain a second fluid, an input port 121 coupled to the chamber 124 to accept the second fluid from an external source. Chamber 124 is coupled to output port 122. Output port 122 may be larger than the input port 121. Auxiliary flow generator 120 further comprises a heater 123 contained in chamber 124. The heater 123 may be selectively activated for a period of time and rapidly vaporizes the contained fluid in the chamber 124 and generates one or more bubbles. In various embodiments, the heater 123 is activated by an active feedback controller 126. The rapid expansion of the bubbles within the chamber 124 causes the second fluid in the chamber to increase in pressure to the second pressure level (higher than the first pressure level). The second fluid in the chamber 124 is then forced out of said output port 122 and merged with fluid flow 111 causing the turbulence inside the microchannels to occur.

The timing of turning the heater 123 on and off is based upon the frequency in which the desired second pressure is created. Further, in various embodiments, in each instance, it is timed such that the bubble has a chance to collapse within the chamber 124 after displacing the second fluid, but before the bubble can travel out of the output port 122 and merged into the fluid flow 111. For the embodiments, since the output port 122 is larger than the input port 121, a significantly higher volume of the second fluid may be pumped out of the output port than the input port.

As described earlier, the second fluid upon merging into the fluid flow 111 at the second pressure level creates turbulence in fluid flow 111 inside the microchannels of the microchannel cooling subsystem 200. The system is designed such that the turbulence provides sufficient energy to dislodge vapor blockages. In various embodiments, it may be further designed such that the turbulence may also provide for wetting of the microchannels (not shown) contained in the microchannel cooling subsystem to assist in at least temporarily reducing the likelihood of formation of vapor blockages.

Accordingly, for the embodiment, auxiliary flow generator 120 may also be referred to as a bubble generator. In various embodiments, the microchannel cooling subsystem 200 comprises a cold plate 210, which may have one or more microchannels (not shown), and is thermally coupled to a microelectronic die 220.

Figure 2:
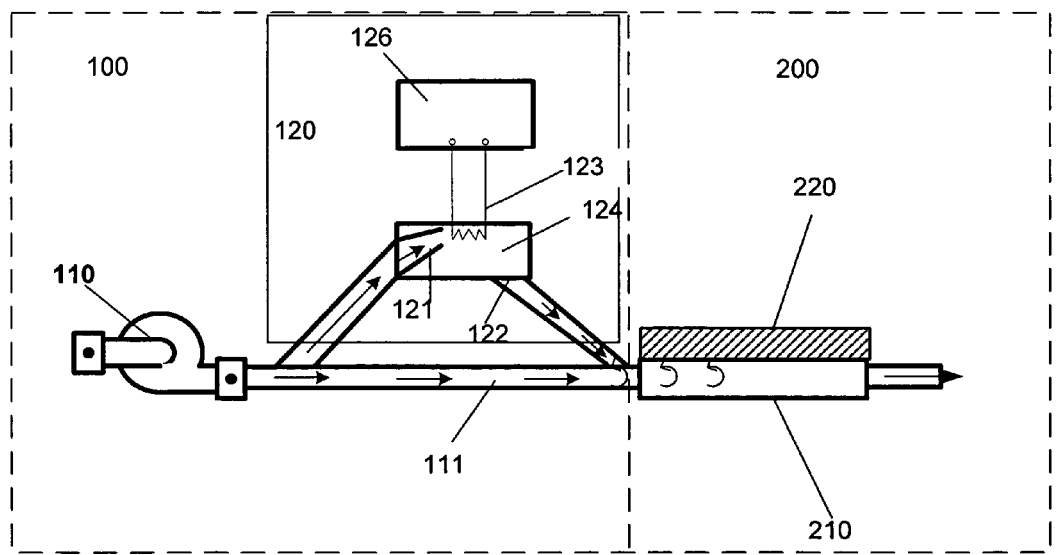
FIG. 2 is a functional view of a pumping mechanism coupled to a microchannel cooling system, in accordance with another embodiment of the present invention.

FIG. 2 illustrates cooling system 2, in accordance with another embodiment. The embodiment is substantially the same as the embodiment of FIG. 1, except the input port of chamber 124 is specifically coupled to the output of pump 110. In other words, the external source of the second fluid provided to chamber 124 is pump 110. Stated another way, for this embodiment, a tributary flow is created from the main flow at an upstream point, and rejoined with the main flow at a downstream point. While flowing through the "tributary", the pressure of the fluid may be selectively changed at the desired points in time, as it flows through chamber 124, by creating bubbles in the tributary flow, using e.g. heater 123. As described earlier, in various embodiments, the arrangement is designed such that the bubbles will collapse prior to the portion of the fluid carrying the bubbles exit chamber 124.

Upstream and downstream are characterized referencing the direction of the fluid flow towards the microchannel cooling subsystem 210. They are used for ease of understanding, and are not to be read as limiting on the invention.

In various embodiments, the type of fluid employed, the flow rate, the nominal and increased pressure of the flow, the capacity of the heater, and so forth, are application dependent. That is, they are dependent on amount of heat generated by the heat source, the expected heat removal efficiency of the microchannel cooling subsystem 210, the number of microchannels and so forth. The optimal parameters, i.e. nature of the fluid, flow rate, pressures, and so forth, may be empirically selected, based on the application.

In various embodiments, a number of cooling fluids may be used, including, but not limited to, deionized (DI) water. Because of its relatively low ionic conductivity, DI water ($10^{-3}$ S/m) is particularly suitable as a working fluid to maintain a moderate thermodynamic efficiency.

In various embodiments, the cooling system may also be operated in either a single phase liquid or two-phase liquid/gas mode.

In other embodiments, either the microchannels or the entire self contained cooling system may be contained in other devices, including, but not limited to, a flat heat spreader and a heat sink. Embodiments having self-contained cooling systems can be used to retrofit pre-existing devices, or devices of a predetermined standard size. The microchannels may also be integrated with the microelectronic die package.

Figure 3:
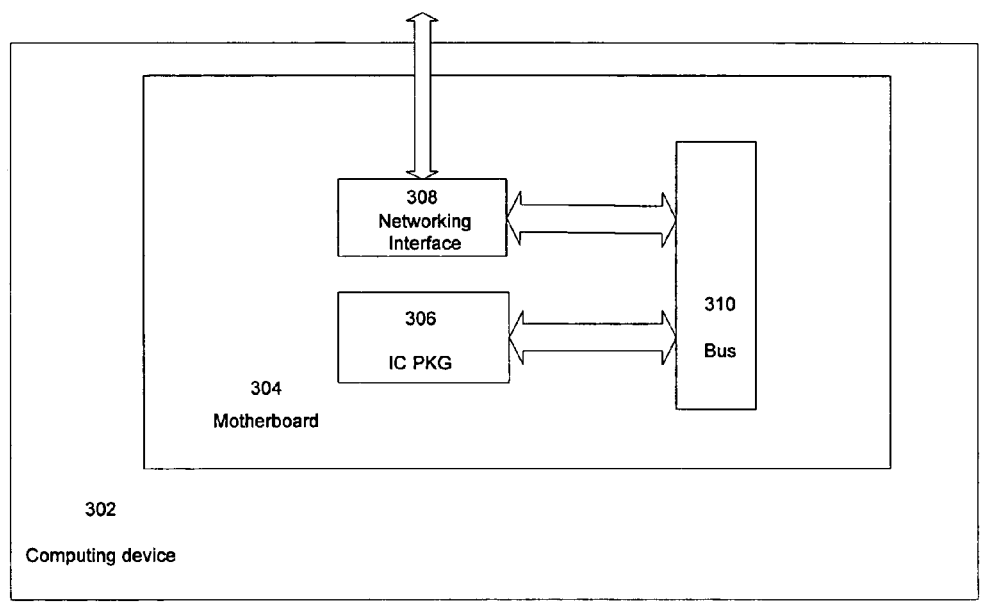
FIG. 3 illustrates a system having the microchannel cooling subsystem of FIG. 1 in accordance with one embodiment.

FIG. 3 illustrates a system in accordance with one embodiment. As illustrated, for the embodiment, system 300 includes computing device 302 for processing data. Computing device includes a motherboard 304. Motherboard 304 includes in particular an integrated circuit (IC) package 306, a networking interface 308 coupled to a bus 310. More specifically, central processing unit 306 is microchannel cooling subsystem 200 with pumping mechanism 100.

Depending on the applications, system 300 may include other components, including but are not limited to a bus, volatile and non-volatile memory, a microprocessor, a chipset, mass storage (such as hard disk, compact disk (CD), digital versatile disk (DVD) and so forth), and so forth. In various embodiments, system 300 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The pumping mechanism creating turbulence in a fluid flow in a microchannel cooling subsystem in embodiments in accordance with the present invention disclosed herein will likely enhance heat dissipation, and/or provide better wetting of the microchannels to reduce the likelihood of vapor lock, by dislodging the vapor locks. This will likely to have the effect of reducing the microelectronic die temperature and/or spreading the heat internally within the microelectronic die, depending on the layout of the microchannels. The benefits of reducing thermal gradients and lowering average microelectronic die operating temperature may include: reduction of thermal stresses that are a significant reliability issue and enhanced microelectronic die electrical performance.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
   an input to a microchannel cooling subsystem to receive a fluid flow:
   a pumping mechanism coupled to said input of said microchannel cooling subsystem, including a pump adapted to provide said fluid flow, and a fluid flow modifier adapted to cause a turbulence in the fluid flow inside said microchannel cooling subsystem to clear a vapor lock in the fluid flow inside said microchannel cooling subsystem.

2. The apparatus of claim 1, wherein the fluid flow modifier comprises a bubble generator, with said pump coupled to said input of the microchannel cooling subsystem to provide said fluid flow at a first pressure level, and said bubble generator coupled to said input of said microchannel cooling subsystem to cause said turbulence in the provided fluid flow inside said liquid to said microchannel cooling subsystem.

3. The apparatus of claim 2, wherein said pump is selected from a group consisting of an electrokinetic (ek) pump, a vane pump, a piston pump and a diaphragm pump.

4. The apparatus of claim 2, wherein said bubble generator is adapted to generate one or more bubbles during a period of time sufficient to cause the pressure of said provided fluid flow to increase from said first pressure level to a second pressure level for said period of time to cause said turbulence in said provided fluid flow inside said microchannel cooling subsystem.

5. The apparatus of claim 4, wherein said bubble generator further comprises a chamber to contain a second fluid, an input port to receive said second fluid, an output port coupled to the input of said microchannel cooling subsystem to output said second fluid for said microchannel cooling subsystem, and a heater to heat said second fluid, changing a volume of said second fluid from a fluid state to a gas state within said period of time, to cause said turbulence in said provided fluid flow inside said microchannel cooling subsystem.

6. The apparatus of claim 5, wherein said input port of said bubble generator is coupled to said pump, and said second fluid is a diverted portion of the provided fluid flow.

7. The apparatus of claim 5, wherein said heater is activated by an active feedback controller.

8. The apparatus of claim 1, wherein the said microchannel cooling subsystem comprises a cold plate having a microchannel.

9. The apparatus of claim 1, wherein the apparatus further comprises said microchannel cooling subsystem, including a plurality of microchannels.

10. The apparatus of claim 1, wherein the apparatus further comprises
said microchannel cooling subsystem; and
a microelectronic die thermally coupled to said microchannel cooling subsystem, to be cooled by the microchannel cooling subsystem.

11. The apparatus of claim 10, wherein the microelectronic die is a microprocessor.

12. A method comprising
supplying a microchannel cooling subsystem with a fluid flow at a first pressure; and
causing a turbulence in said provided fulid flow inside said microchannel cooling subsystem to clear a vapor lock in said provided fluid flow inside said microchannel cooling subsystem.

13. The method of claim 12, wherein said causing comprises causing the pressure of the fluid flow to change for a period of time.

14. The method of claim 13, wherein said causing of the pressure change comprises generating one or more bubbles in a second fluid to be combined with the provided fluid flow, during said period of time.

15. The method of claim 14, wherein said generating comprises heating the second fluid.

16. The method of claim 15, wherein the second fluid is a diverted portion of the provided fluid flow, and the method further comprises diverting the provided fluid flow.

17. A system comprising:
an IC package including a microchannel cooling subsystem adapted to receive a fluid flow;
a pumping mechanism coupled to said microchannel cooling subsystem of said IC package, including a pump adapted to provide said fluid flow, and a fluid flow modifier adapted to cause a turbulence in said provided fluid flow inside said microchannel cooling subsystem to clear a vapor lock in said provided fluid flow inside said microchannel cooling subsystem; and
a networking interface coupled to the IC package.

18. The system of claim 17, wherein the fluid flow modifier comprises a bubble generator, with said pump coupled to the microchannel cooling system to provide said fluid flow at a first pressure level, and said bubble generator coupled to the microchannel cooling system to cause said turbulence in the provided fluid flow inside said microchannel cooling subsystem.

19. The system of claim 18, wherein said pump is selected from a group consisting of a vane pump, a piston pump and a diaphragm pump.

20. The system of claim 18, wherein said bubble generator is adapted to generate one or more bubbles during a period of time to cause the pressure of said provided fluid flow to increase from said first pressure level to a second pressure level for said period of time to cause said turbulence in said provided fluid flow inside said microchannel cooling subsystem.

21. The system of claim 18, wherein said bubble generator comprises a chamber to contain a second fluid, an input port to receive said second fluid, an output port coupled to the microchannel subsystem to output said second fluid, and a heater to heat said second fluid, changing a volume of said second fluid from a fluid state to a gas state within said period of time, to cause said turbulence in said provided fluid flow inside said microchannel cooling subsystem.

22. The system of claim 21, wherein said input port of said bubble generator is coupled to said pump, and said second fluid is a diverted portion of the provided fluid flow.

23. The system of claim 22, wherein said heater is activated by an active feedback controller.

24. The system of claim 17, wherein said microchannel cooling subsystem comprises a cold plate having a microchannel.

25. The system of claim 17, wherein said microchannel cooling subsystem includes a plurality of microchannels.

26. The system of claim 17, wherein the system is selected from a group consisting of a set-top box, a DVD player and a server.

* * * * *

UNITED STATES PATENT AND TRADEMARK OFFICE
CERTIFICATE OF CORRECTION

| | | |
|---|---|---|
| PATENT NO. | : 6,967,840 B2 | Page 1 of 1 |
| APPLICATION NO. | : 10/814051 | |
| DATED | : November 22, 2005 | |
| INVENTOR(S) | : Gregory M. Chrysler and Ioan Sauciuc | |

It is certified that error appears in the above-identified patent and that said Letters Patent is hereby corrected as shown below:

Column 4
Line 36, "...This will likely to have..." should read --...This is likely to have...--.
Line 63, "...a fluid flow:..." should read --...a fluid flow;...--.

Column 5
Line 54, "...provided fulid..." should read --...provided fluid...--.

Signed and Sealed this

Third Day of April, 2007

JON W. DUDAS
*Director of the United States Patent and Trademark Office*